(12) United States Patent
Xiang

(10) Patent No.: US 6,734,527 B1
(45) Date of Patent: May 11, 2004

(54) CMOS DEVICES WITH BALANCED DRIVE CURRENTS BASED ON SIGE

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/316,826

(22) Filed: Dec. 12, 2002

(51) Int. Cl.[7] .............................................. H01L 29/12
(52) U.S. Cl. ...................................................... 257/616
(58) Field of Search .............................. 257/19, 55, 63, 257/65, 190, 192, 279, 351, 369, 410, 411, 616; 438/154, 199, 216, 217, 275, 287

(56) References Cited

U.S. PATENT DOCUMENTS

| | | | | |
|---|---|---|---|---|
| 5,155,571 A | * | 10/1992 | Wang et al. ................... | 257/19 |
| 5,847,419 A | * | 12/1998 | Imai et al. ................... | 257/192 |
| 5,970,331 A | * | 10/1999 | Gardner et al. ............. | 438/199 |
| 6,255,700 B1 | * | 7/2001 | Yoshida et al. ............. | 257/380 |
| 6,310,367 B1 | * | 10/2001 | Yagishita et al. ........... | 257/190 |
| 6,339,232 B1 | * | 1/2002 | Takagi .......................... | 257/192 |
| 6,455,330 B1 | * | 9/2002 | Yao et al. ...................... | 438/3 |
| 6,475,869 B1 | * | 11/2002 | Yu .............................. | 438/303 |

* cited by examiner

Primary Examiner—Carl Whitehead, Jr.
Assistant Examiner—Jennifer M. Dolan

(57) ABSTRACT

CMOS devices with balanced drive currents are formed with a PMOS transistor based on SiGe and a deposited high-k gate dielectric. Embodiments including forming a composite substrate comprising a layer of strained Si on a layer of SiGe, forming isolation regions defining a PMOS region and an NMOS region, forming a thermal oxide layer on the strained Si layer, selectively removing the thermal oxide layer and strained Si layer from the PMOS region, depositing a layer of high-k material on the layer of SiGe in the PMOS region and then forming gate electrodes in the PMOS and NMOS regions.

7 Claims, 5 Drawing Sheets

CMOS DEVICES WITH BALANCED DRIVE CURRENTS BASED ON SIGE

FIELD OF THE INVENTION

The present invention relates to micro-miniaturized semiconductor devices comprising CMOS transistors on silicon-germanium. The present invention is particularly applicable in fabricating CMOS transistors with balanced drive currents.

BACKGROUND OF THE INVENTION

The relentless pursuit of miniaturized semiconductor devices continues to challenge the limitations of conventional semiconductor materials and fabrication techniques. Conventional semiconductor devices typically comprise a plurality of active devices in or on a common semiconductor substrate, e.g., CMOS devices comprising at least a pair of PMOS and NMOS transistors in spaced adjacency. Current technology utilizes crystalline semiconductor wafers as substrates, such as a lightly p-doped epitaxial ("epi") layer of silicon (Si) grown on a heavily-doped, crystalline Si Substrate. The low resistance of the heavily-doped substrate is necessary for minimizing susceptibility to latch-up, whereas the light doping of the epi layer permits independent tailoring of the doping profiles of both the p-type and n-type wells formed therein as part of the fabrication sequence, thereby resulting in optimal PMOS and NMOS transistor performance.

The use of the very thin epi layers, i.e., several $\mu$m thick, is made possible by utilizing shallow trench isolation ("STI"), which advantageously minimizes up-diffusion of p-type dopant(s) from the more heavily-doped substrate into the lightly-doped epi layer. In addition, STI allows for closer spacing of adjacent active areas by avoiding the "bird's beak" formed at the edge of each LOCOS isolation structure. STI also provides better isolation by creating a more abrupt structure, reduces the vertical step from active area to isolation to improve gate lithography control, eliminates the high temperature field oxidation step that can cause problems with large diameter, i.e., 8 inch, wafers, and is scalable to future logic technology generations.

Substrates based on "strained silicon" have attracted interest as a semiconductor material which provides increased speeds of electron and hole flow therethrough, thereby permitting fabrication of semiconductor devices with higher operating speeds, enhanced performance characteristics, and lower power consumption. A very thin, tensilely strained, crystalline silicon (Si) layer is grown on a relaxed, graded composition of silicon-germanium (SiGe) buffer layer several microns thick, which SiGe buffer layer in turn is formed on a suitable crystalline substrate, e.g., a Si wafer or a silicon-on-insulator (SOI) wafer. The SiGe buffer layer typically contains 12 to 25 at. % Ge. Strained Si technology is based upon the tendency of the Si atoms, when deposited on the SiGe buffer layer, to align with the greater lattice constant (spacing) of Si and Ge atoms therein (relative to pure Si). As a consequence of the Si atoms being deposited on a substrate (SiGe) comprised of atoms which are spaced further apart, they "stretch" to align with the underlying Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size.

The mobility of electrons is faster than the mobility of holes in conventional bulk silicon substrates. Accordingly, in conventional CMOS transistors, the drive current of the PMOS transistor is less than the drive current of the NMOS transistor creating an imbalance. This imbalance is exacerbated in CMOS transistors fabricated on or within a tensilely stressed active device area formed in a strained lattice semiconductor substrate, e.g., strained Si on SiGe, because the increase in electron mobility is greater than the increase in hole mobility.

Accordingly, there exists a need for methodology enabling the fabrication of semiconductor devices comprising narrow width CMOS transistors with balanced drive currents.

DISCLOSURE OF THE INVENTION

An advantage of the present invention is a method of fabricating a semiconductor device comprising CMOS transistors with balanced drive currents.

Another advantage of the present invention is a semiconductor device comprising CMOS transistors with balanced drive currents.

Additional advantages &id other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are obtained in part by a method of manufacturing a semiconductor device comprising a PMOS transistor and an NMOS transistor, the method comprising; forming a substrate comprising a layer of silicon (Si) having a strained lattice on a layer of silicon-germanium (SiGe); forming isolation regions defining a PMOS region and an NMOS region; forming a thermal oxide layer on the strained Si layer in the PMOS and NMOS regions; selectively removing the thermal oxide layer and strained Si layer from the SiGe layer in the PMOS region; depositing a layer of dielectric material on the layer of SiGe in the PMOS region; and forming transistors in the PMOS and NMOS regions, wherein: a portion of the thermal oxide layer serves as the gate dielectric layer of the NMOS transistor, and a portion of the deposited layer of dielectric material serves as the gate dielectric layer of the PMOS transistor.

Another advantage of the present invention is a semiconductor device comprising: a substrate comprising a layer of silicon-germanium (SiGe); a PMOS transistor comprising: a gate dielectric layer of material having a high dielectric constant (k) of 10 or more deposited on the layer of SiGe; a gate electrode on the gate dielectric layer, and an NMOS transistor comprising: a layer of strained silicon (Si) on the layer of SiGe; a thermally formed gate oxide layer on the layer of strained Si; and a gate electrode on the thermally formed gate oxide layer.

Embodiments of the present invention comprise depositing, as by chemical vapor deposition (CVD), a dielectric material having a high dielectric constant (k) of 10 or higher on the SiGe layer in the PMOS region, as at a thickness of 10 Å to 50 Å. Embodiments of the present invention comprise forming the thermal oxide layer at a thickness of 10 Å to 20 Å, which is less than the thickness of the layer of high dielectric constant (k) material which serves as the gate dielectric layer for the PMOS transistor.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

In FIGS. 1 through 5, similar features or elements are denoted by similar reference characters.

DESCRIPTION OF THE INVENTION

The present invention addresses and solves the problem of simultaneously optimizing the drive currents for PMOS and NMOS transistors based on strained Si substrates in a cost effective, efficient manner. The present invention stems from the recognition that the hole mobility in SiGe is higher than the hole mobility in strained Si. Accordingly, embodiments of the present invention comprise strategically removing the strained Si layer from the PMOS region and forming the PMOS transistor directly on the underlying SiGe layer. Further, in accordance with the present invention, a high dielectric constant (k) material is deposited on the SiGe layer. Advantageously, by depositing a high dielectric constant (k) material as the gate dielectric layer for the PMOS transistor, the thickness of the gate dielectric layer can be increased to achieve capacitance comparable to that achieved utilizing of a lower dielectric constant (k) material at an undesirably reduced thickness. In other words, the leakage for the PMOS transistor having a thick high dielectric constant (k) gate dielectric layer would be comparable to the leakage of the NMOS transistor having a thin low k gate dielectric layer, and the drive current of the PMOS transistor would be increased comparable to the of drive current to the NMOS transistor. Thus, the SiGe channel PMOS transistor in; accordance with the embodiments of the present invention has a higher carrier mobility and, hence, a higher drive current than would be the case for a PMOS transistor formed on a strained Si layer.

Figure 1:
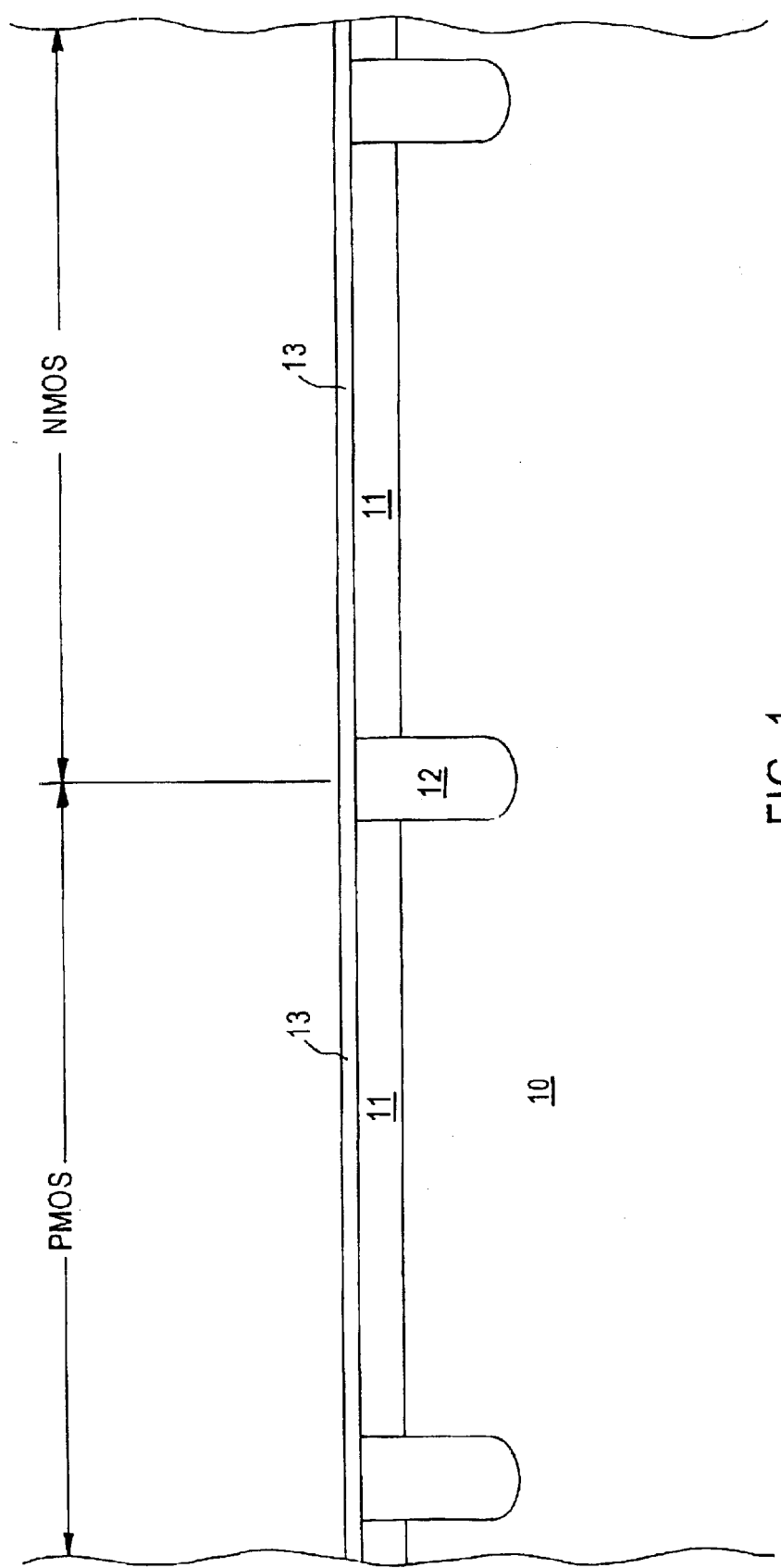
FIGS. 1 through 5 schematically illustrate sequential phases of a method in accordance with an embodiment of the present invention.

An embodiment to the present invention is schematically illustrated in FIGS. 1 through 4. Adverting to FIG. 1. STI structures 12 are formed in a substrate comprising a layer of strained Si 11 on a layer of SiGe 10. The region at the left of FIG. 1 is designated as the PMOS region, while the region at the right is designated as the NMOS region. A thermal oxide layer 13 is then formed on strained Si layer 11, in a comventional matter, as by heating in an oxygen ambient. Thermal oxide layer 13 is typically formed at a thickness of 10 Å to 20 Å.

Figure 2:
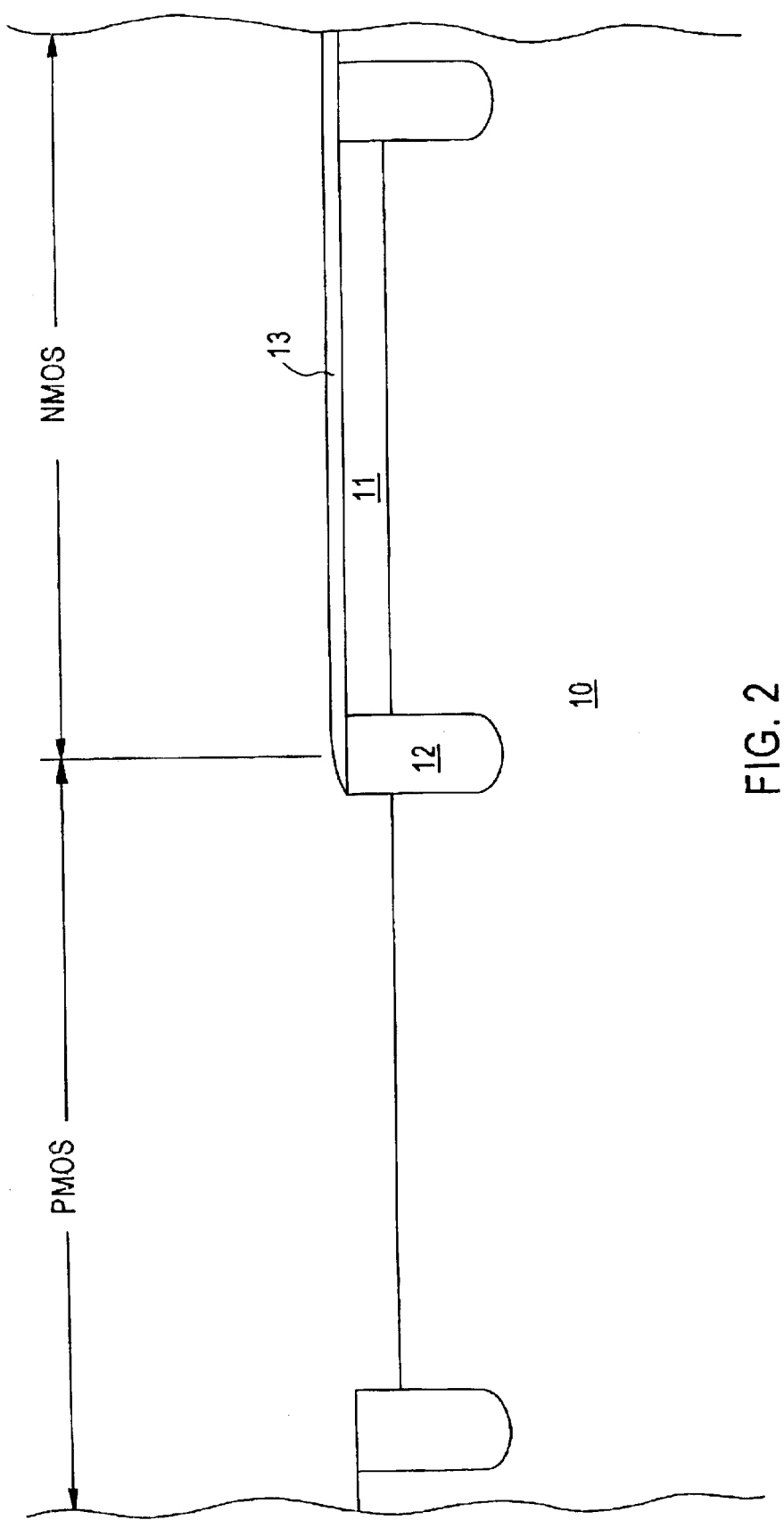

In accordance with the embodiments of the present invention, the NMOS region is suitably masked and the thermal oxide layer 13 along with the strained Si layer 11 are selectively removed from the PMOS region, as illustrated in FIG. 2, leaving the SiGe layer 10 exposed in the PMOS region. Thermal oxide layer 13 may be removed employing conventional etching techniques, as with a buffered hydrofluoric acid solution, while strained Si layer 11 can be removed employing conventional etching techniques, as with a solution of hydrofluoric acid and nitric acid in acetic acid.

Figure 3:
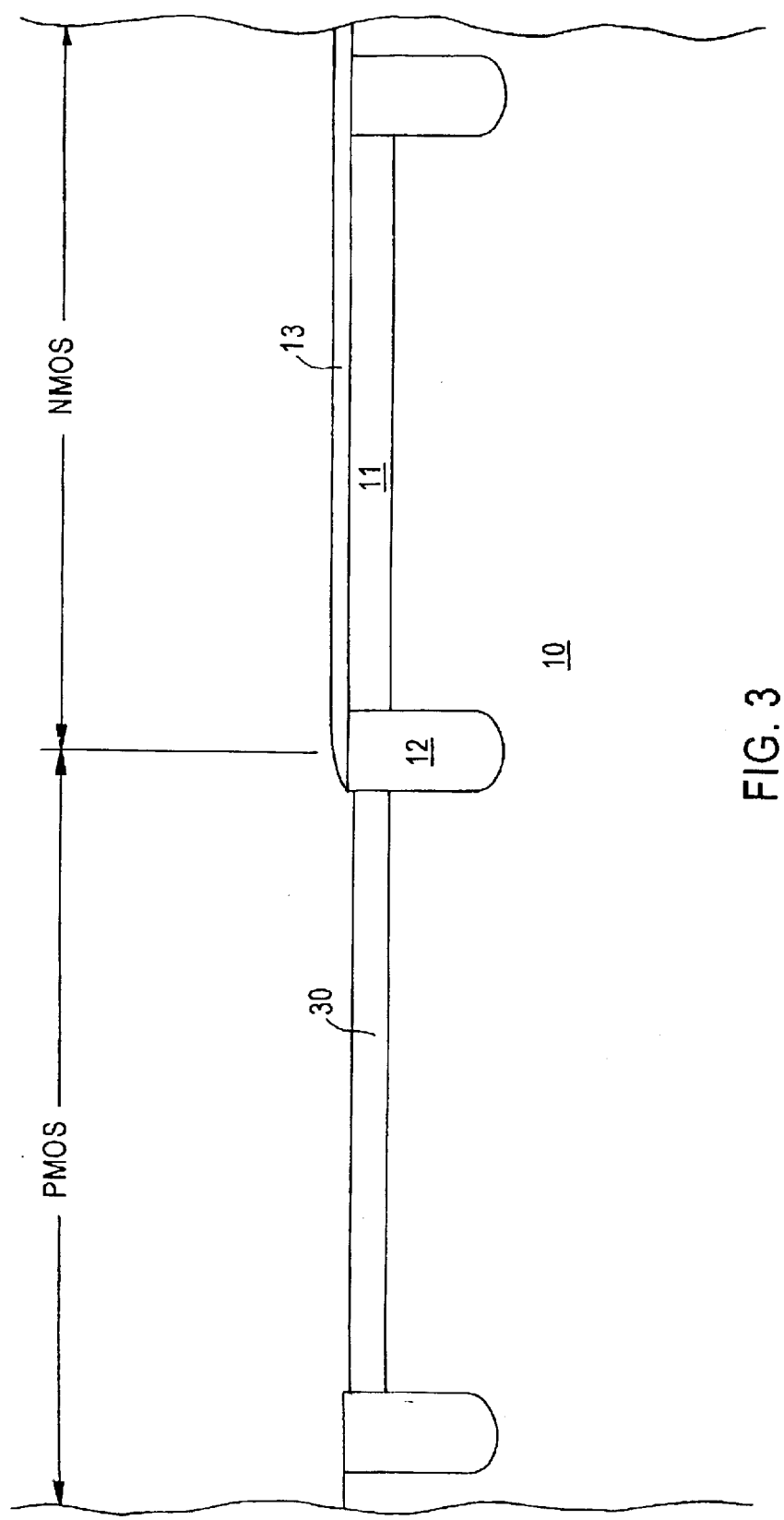

Subsequently, as illustrated in FIG. 3, a layer of high dielectric constant (k) material 30 is selectively deposited in the PMOS region. High dielectric constant (k) layer 30 ultimately serves as the gate dielectric for the PMOS transistor, and may be deposited by CVD as to thickness of 10 Å to 50 Å. Typically, high dielectric constant (k) layer 30 is deposited at a thickness greater than the thickness of thermal oxide layer 13. The thickness of the high dielectric constant (k) material depends on the particular material employed and the targeted capacitance. Various materials can be employed for dielectric layer 30, such as silicon nitrides, silicon oxinitrides, metal oxides, metal silicates, metal aluminates, metal titanates, metal zirconates, ferroelectric materials, binary metal oxides, and ternary metal oxides suitable high-k dielectric material include aluminum oxide, hafnium oxide, zirconium oxide, lanthanum oxide, titanium oxide, tantalum oxide, tungsten oxide, cerium oxide, yttrium oxide, zirconium silicate, hafnium silicate, haflium aluminate, lanthanum aluminate, lead titanate, barium titanate, strontium titanate, barium strontium titanate, lead zirconate; ferroelectric oxides, ternary metal oxides, PST ($PbSc_xTa_{1-x}O_3$), PZN ($PbZn_xNb_{1-x}O_3$), PZT ($PbZr_xTi_{1-x}O_3$), and PMN $PbMg_xNb_{1-x}O_3$).

Figure 4:
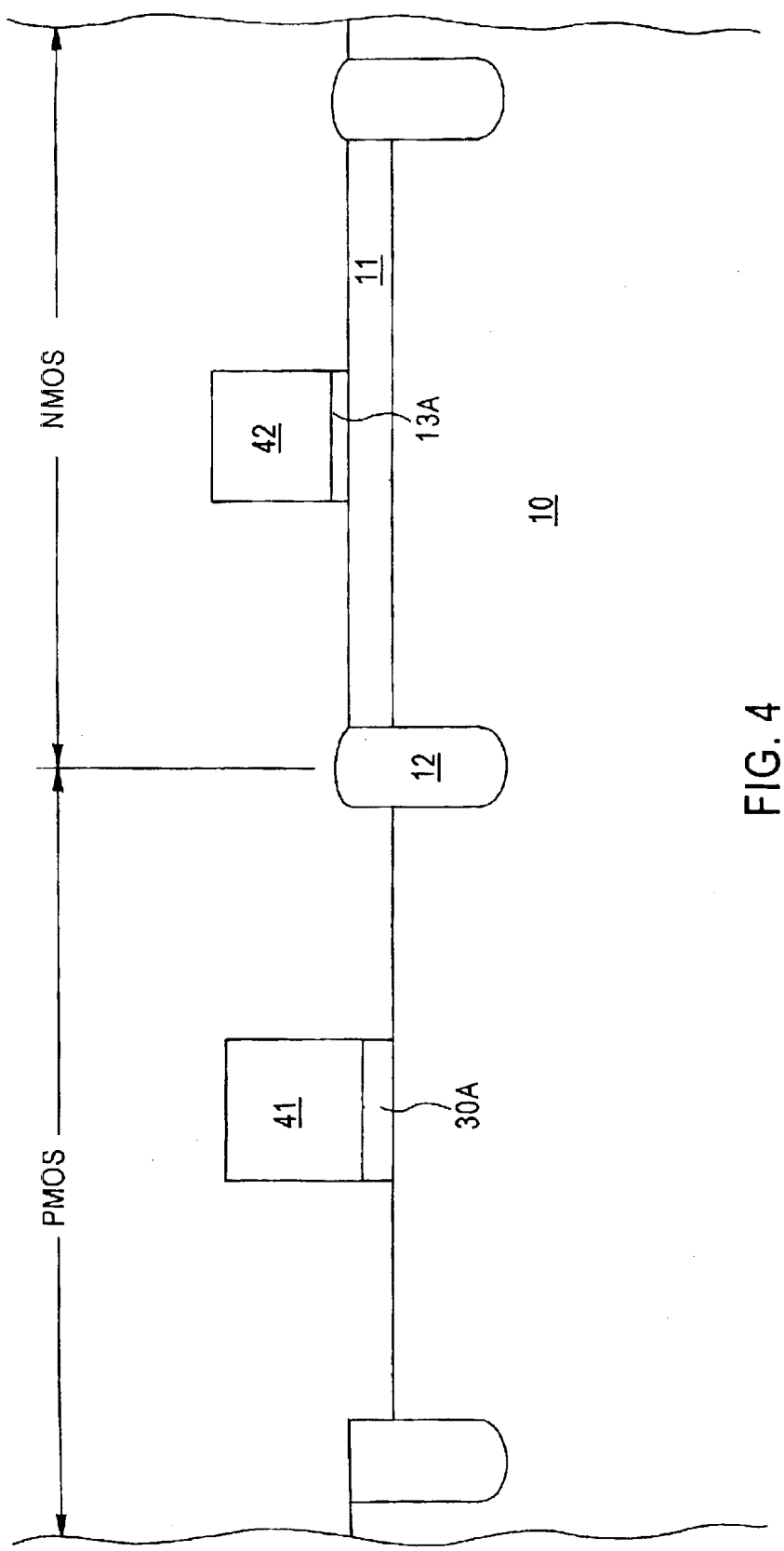

Adverting to FIG. 4, a layer of semiconductor material or gate electrode layer is deposited, such as doped polycrystalline silicon, and patterning is conducted employing conventional photolythographic and etching techniques to form gate electrode 42 in the NMOS with gate dielectric layer 13A between gate electrode 42 and strained Si layer 11. Gate dielectric layer 13A is a portion of the originally formed thermal oxide layer 13 comprising silicon oxide. Gate electrode 41 is formed in the PMOS with gate dielectric layer 30A between the gate electrode 41 and SiGe layer 10. Gate dielectric 30A is a portion of the deposited high dielectric constant (k) layer 30.

Figure 5:
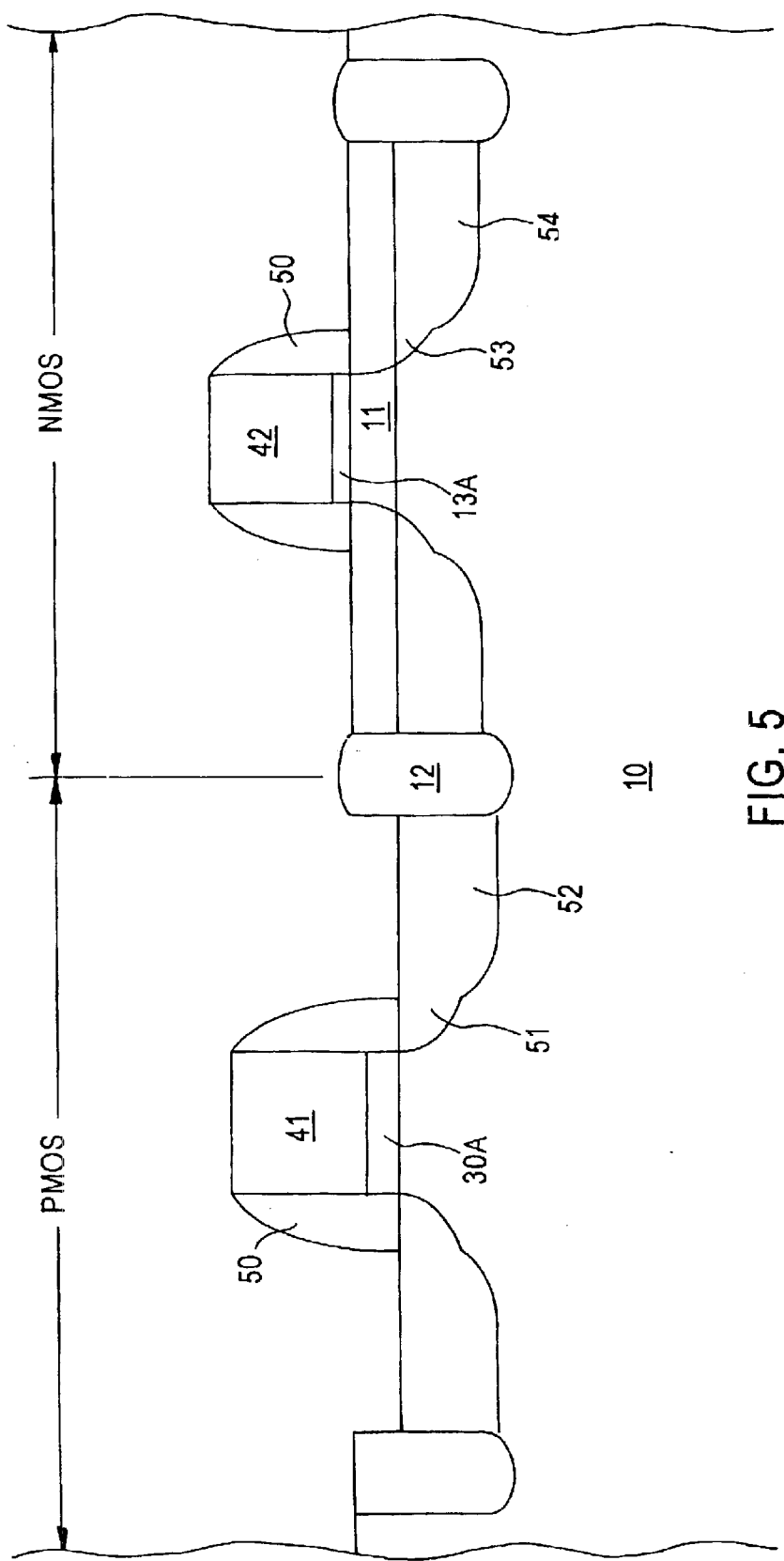

Subsequent processing is then implemented, as by employing conventional techniques to form source/drain extensions 51, 53, shown in FIG. 5, and deep source/drain regions 52, 54, with sidewall spacers 50, such as silicon nitride, on the side surfaces of the gate electrodes. Such conventional processing may include utilizing the gate electrodes as a mask and ion implanting impurities to form source/drain extensions 51 and 53 in the PMOS and NMOS regions, respectively, forming sidewall spacers 50 on the side surfaces of the gate electrodes, and then forming the deep source/drain regions 52 and 54 for the PMOS and NMOS transistors, respectively.

The present invention provides methodology enabling the fabrication of high quality, high operating speed semicondtictor devices based upon strained lattice technology, comprising micro-miniaturized CMOS devices with maximized, balanced transistor drive currents. The inventive methodology can be practiced utilizing conventional methodologies and instrumentalities at rates consistent with the throughput requirements of automated fabrication techniques and is fully compatible with conventional process flow for the manufacture of high-density integrated semiconductor devices.

The present invention enjoys industrial applicability in fabricating various types of semiconductor devices. The present invention enjoys particular industrial applicability in fabricating miniaturized semiconductor devices with high operating speeds.

In the previous description, numerous specific details are set forth, such as specific materials, structures, reactants, processes, etc., in order to provide a better understanding of the present invention. However, the present invention can be practiced without resorting to the details specifically set forth. In other instances, will-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A semiconductor device comprising:
    a substrate comprising a layer of silicon-germanium (SiGe);
    a PMOS transistor comprising:
        a gate dielectric layer of a material having a high dielectric constant (k) of 10 or higher deposited on the layer of SiGe; and
        a gate electrode on the gate dielectric layer; and
    an NMOS transistor comprising:
        a layer of silicon (Si) having a strained lattice on the layer of SiGe;
        a thermally formed gate oxide layer on the layer of strained Si; and
        a gate electrode on the thermally formed gate oxide layer.

2. The semiconductor device according to claim 1, wherein the high dielectric constant (k) material is selected from the group consisting of silicon nitrides, silicon oxinitrides, metal oxides, metal silicates, metal aluminates, metal titanates, metal zirconates, ferroelectric materials, binary metal oxides and ternary metal oxides.

3. The semiconductor device according to claim 2, wherein the gate dielectric layer of the PMOS transistor is thicker than the gate dielectric layer of the NMOS transistor.

4. The semiconductor device according to claim 3, wherein:
    the gate dielectric layer of the PMOS transistor has a thickness of 10 Å to 50 Å; and
    the gate dielectric layer of the NMOS transistor has a thickness of 10 Å to 20 Å.

5. The semiconductor device according to claim 1, wherein the gate dielectric layer of the PMOS transistor has a thickness of 10 Å to 50 Å.

6. The semiconductor device according to claim 5, wherein the gate dielectric layer of the NMOS transistor has a thickness of 10 Å to 20 Å.

7. A semiconductor device comprising:
    a substrate comprising a layer of silicon-germanium (SiGe);
    a PMOS transistor comprising:
        a gate dielectric layer of a material having a high dielectric constant (k) of 10 or higher deposited on the layer of SiGe; and
        a polycrystalline silicon gate electrode on the gate dielectric layer; and
    an NMOS transistor comprising:
        a layer of silicon (Si) having a strained lattice on the layer of SiGe;
        a thermally formed gate oxide layer on the layer of strained Si; and
        a polycrystalline silicon gate electrode on the thermally formed gate oxide layer.

* * * * *